United States Patent [19]

Giaccardi

[11] 3,989,963

[45] Nov. 2, 1976

[54] CONTROL CIRCUITS FOR PIEZO ELECTRIC TRANSDUCERS

[75] Inventor: Eraldo Giaccardi, Turin, Italy

[73] Assignee: Fiat Societa per Azioni, Turin, Italy

[22] Filed: May 28, 1975

[21] Appl. No.: 581,512

[30] Foreign Application Priority Data

Aug. 1, 1974 Italy .................................. 69441/74

[52] U.S. Cl. .................................. 310/8.1; 318/116

[51] Int. Cl.² .......................................... H01L 41/04

[58] Field of Search ................. 310/8, 8.1; 318/116, 318/118

[56] References Cited

UNITED STATES PATENTS

| | | | |
|---|---|---|---|
| 3,638,087 | 1/1972 | Ratcliff | 310/8.1 X |
| 3,701,903 | 10/1972 | Merhar | 310/8.1 X |
| 3,740,582 | 6/1973 | McCusker et al. | 310/8.1 X |
| 3,801,893 | 4/1974 | Joyce | 310/8.1 X |
| 3,911,298 | 10/1975 | Borsdorf | 310/8.1 |

*Primary Examiner*—Mark O. Budd
*Attorney, Agent, or Firm*—Sughrue, Rothwell, Mion, Zinn & Macpeak

[57] ABSTRACT

A control circuit for cyclically operating one or more piezoelectric transducers to transmit and receive ultrasonic signals is disclosed. The circuit comprises a power transistor in series with an induction coil and controlled by a timing circuit to conduct for a short time during each cycle. As the power transistor cuts off a high voltage pulse is generated by the induction coil and this is fed via a zener diode as the transmission signal to the or each piezoelectric transducer across which is connected a switching circuit comprising a potential divider and a pair of opposite polarity diodes which automatically feed off the high voltage transmission signal to earth and pass low strength received signals to an amplifier.

4 Claims, 1 Drawing Figure

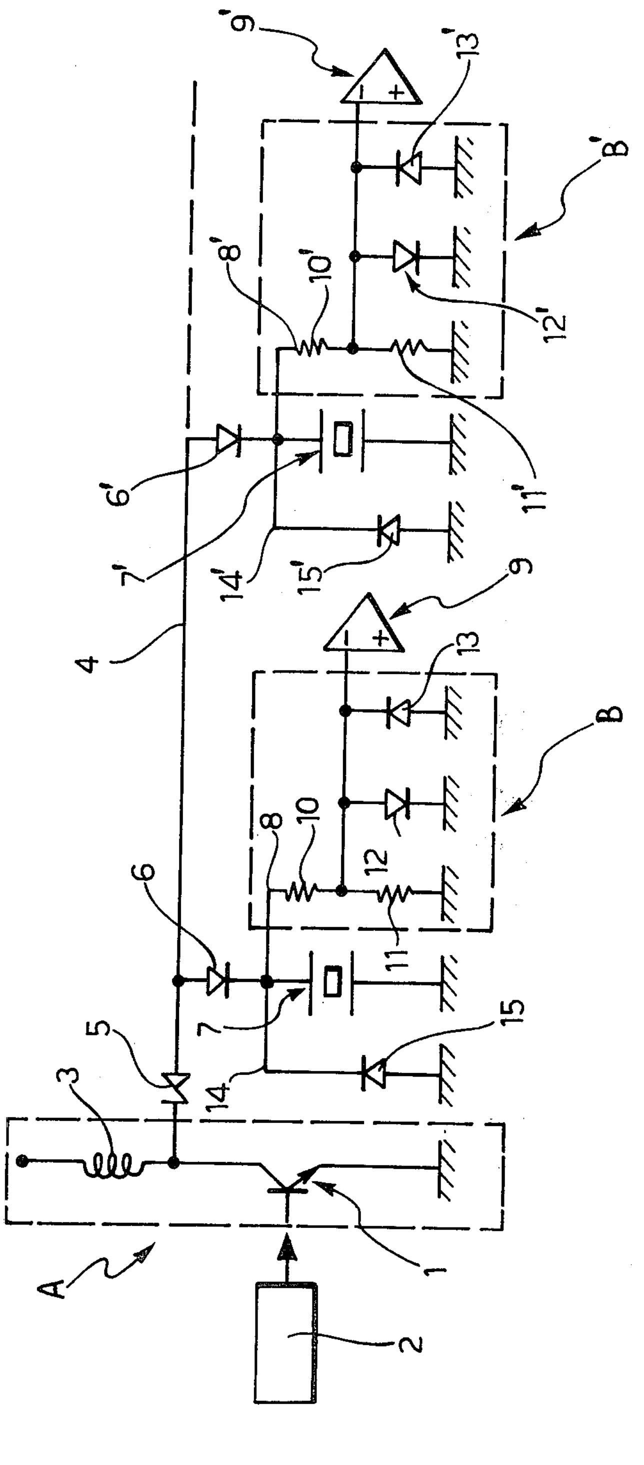
A
B
B'
1
2
3
4
5
6
6'
7
7'
8
8'
9
9'
10
10'
11
11'
12
12'
13
13'
14
14'
15
15'

CONTROL CIRCUITS FOR PIEZO ELECTRIC TRANSDUCERS

The present invention relates to a circuit for controlling the operation of one or more piezo electric transmitters and particularly to a circuit for controlling the switching from transmission to reception of systems using a plurality of ultrasonic piezoelectric transducers.

With systems using at least two ultrasonic piezoelectric transducers which must be simultaneously supplied for short periods of time to operate as transmitters and then be immediately switched over to a reception state, the main problem consists in adequately supplying the transducers for operation as transmitters without dissipating excessive power, and at the same time rendering the signals received by the transducer independent of the characteristics of the power transistors used for the supply.

An obvious system to use would be one which provides for the use of a plurality of pulse generators, one for each piezoelectric transducer and a power transistor which is kept at saturation, the transducer circuit being in a condition for reception, except for a short period when it is desired to use the transducer for transmission. A typical operating cycle would last for 2 milliseconds during which the power transistor is saturated except for a period of 5 to 6 microseconds, during which period a pulse signal for transmission is generated. However, this system involves the dissipation of considerable amounts of energy since the transistor operates at saturation for the majority of the time. Moreover, the quality of the received signal does not depend solely on the characteristics of the transducer but also on those of the transistor.

The present invention seeks to avoid these disadvantages by providing a control circuit for the generation of pulses and for the automatic switching from transmission to reception of one or more piezoelectric transducers, in which the power dissipation of the control transistor is reduced to a minimum, and in which it is possible to make the received signal independent of the characteristics of the transistor. In embodiments of the invention it is possible readily to adapt the circuit to control more or less transducers, by suitably varying the dimensions of one component thereof.

According to the present invention, there is provided a control circuit for one or more ultrasonic piezoelectric transducers, cyclically operable to transmit and receive ultrasonic signals characterised in that it comprises a power transistor connected in series with an induction coil connected to a power source, the power transistor being controlled by a timing circuit which cyclically turns the transistor on and off to induce pulse signals from the induction coil, a common line connecting the junction between the collector of the transistor and the coil to the or each piezoelectric transducer, a zener diode in the said common line for preventing a flow of current from the induction coil to the or each transducer when the transistor is non-conducting, the or each transducer having a decoupling diode between itself and the common line and there being a respective switching diode in series with a resistance in parallel with the output of the or each transducer, each switching diode having an impedance such that it is forward biassed to pass current by a pulse signal from the induction coil upon transmission, but not by a received signal from the or the associated piezoelectric transducer.

One embodiment of the invention will now be more particularly described, by way of example, with reference to the accompanying drawing, which is a circuit diagram illustrating the embodiment.

Referring now to the drawing there is shown a power control circuit A for controlling two piezoelectric transducers. The power control circuit A comprises a power transistor 1 the collector/emitter junction of which is connected between an inductance coil 3 and earth. The inductance coil 3 is fed with current from a power source which is not shown; to the junction between the coil 3 and the collector of the transistor 1 is connected a main power line 4 incorporating a zener diode 5. The base of the transistor 1. is connected to a timing circuit 2 which holds the transistor 1 in its non-conducting state except for short time periods when it is rendered conducting. These time periods are only long enough to charge the inductance 3 sufficiently so that when the transistor 1 is cut off the potential at the junction of the coil 3 rises to a value greater than the zener breakdown value and the zener diode 5 passes this pulse for transmission as an ultrasonic signal by two transducers 7,7' connected in parallel between the main power line 4 and earth.

The zener diode 5 acts, when the transistor is non conducting to prevent the continuous supply voltage from reaching the transducers 7, 7' so that the circuit is in the appropriate state for reception by the transducers 7, 7' of ultrasonic signals; at the same time this minimizes the power dissipated by the power transistor 1.

Between each of the transducers 7, 7' and the main power line 4 there is a decoupling diode 6, 6' to prevent interference between the various transducers. In parallel with each of the transducers 7, 7' there is an automatic switch circuit B, B' which comprises a first resistance 10, 10' in series with a switching diode 12, 12' which is earthed. The impedance of the diode 12, 12' is such that it conducts readily the relatively strong signals on the mains power line 4 when the circuit is transmitting, but does not readily conduct the relatively low power signals received from the transducer 7, 7' upon reception. The resistance 10 forms, together with a resistance 11, a potential divider, in parallel with the transducer 7, 7'. The switch circuit B, B' feeds the received signal generated by the transducer 7, 7' to an amplifier 9, 9'; in parallel with the switching diode 12, 12' there is a second diode 13, 13' the polarity of which is opposite that of the switching diode and which acts as a protection diode for the amplifier 9, 9'.

In parallel with each transducer 7, 7', there is also connected a further diode 15, 15' the anode of which is earthed; this diode blocks the negative half-waves which are generated immediately after the transmission signal.

The circuit described makes it possible to reduce to a minimum the power dissipated by the transistor 1, since this is only saturated for a very short part of the operating cycle of the circuit. Moreover, since the transistor is effectively separated by diodes from the piezo-electric transducers 7, 7' the quality of the received signal is independent of the characteristics of the transistor; in addition the circuit described is able to control a large number of transducers operating to change automatically between transmission and reception conditions without requiring expensive switching components but using only two resistances and two diodes.

I claim:

1. A control circuit for an ultrasonic piezoelectric transducer comprising:

a. an electrical power source, b. a power transistor, c. an induction coil connected in series between the collector-emitter junction of said power transistor and said power source, d. timing circuit means connected to the base of said power transistor for cyclically rendering said power transistor conductive and non-conductive, said induction coil generating a high voltage pulse signal as said transistor is rendered non-conductive, e. a piezoelectric transducer, f. a power line coupling the junction between the collector of said power transistor and said induction coil to said piezoelectric transducer, g. a zener diode connected in series in said power line between said junction and said piezoelectric transducer, said zener diode being poled to be reverse biased by direct current from said power source via said induction coil to thereby prevent the passage of current to said piezoelectric transducer except upon the generation of said high voltage pulse signal as said power transistor is rendered non-conductive by said timing circuit, h. a decoupling diode connected in series in said power line between said zener diode and said piezoelectric transducer, and i. a series combination comprising a switching diode and a first resistor, said combination being connected in parallel with said piezoelectric transducer, said switching diode having an impedance such that it is forward biased to pass current from said high voltage pulse signal generated by said induction coil but is not forward biased by a relatively lower voltage signal received from said piezoelectric transducer.

2. The control circuit of claim 1, further comprising a second resistor connected in series with said first resistor and forming a potential divider therewith, said potential divider being connected in parallel with said piezoelectric transducer and said switching diode being connected to the junction between the first and second resistors.

3. The control circuit of claim 1, further comprising:

a. a second diode connected in parallel with said switching diode and arranged in opposite polarity thereto, and b. an amplifier having its input connected to the junction between said first resistor and said switching diode, said second diode serving as an overload protection device for said amplifier.

4. The control circuit of claim 1, further comprising a third diode connected in parallel with said piezoelectric transducer, the anode of said third diode being grounded, said third diode serving to block negative half waves generated immediately following said high voltage pulse signal.

* * * * *